(12) United States Patent
Uno

(10) Patent No.: US 7,145,154 B2
(45) Date of Patent: Dec. 5, 2006

(54) METHOD OF AUTOMATICALLY CORRECTING ABERRATIONS IN CHARGED-PARTICLE BEAM AND APPARATUS THEREFOR

(75) Inventor: Shinobu Uno, Tokyo (JP)

(73) Assignee: Jeol Ltd., Tokyo (JP)

( * ) Notice: Subject to any disclaimer, the term of this patent is extended or adjusted under 35 U.S.C. 154(b) by 98 days.

(21) Appl. No.: 11/016,562

(22) Filed: Dec. 17, 2004

(65) Prior Publication Data

US 2005/0156117 A1 Jul. 21, 2005

(51) Int. Cl.
*H01J 3/26* (2006.01)
*G21K 7/00* (2006.01)

(52) U.S. Cl. .................. 250/396 R; 250/310
(58) Field of Classification Search ............. None
See application file for complete search history.

(56) References Cited

U.S. PATENT DOCUMENTS 6,723,997 B1 * 4/2004 Matsuya et al. ........ 250/396 R
6,858,844 B1 * 2/2005 Zach ........................ 250/310

FOREIGN PATENT DOCUMENTS

JP 2003-521801 A 7/2003

OTHER PUBLICATIONS

M. Haider, W. Bernhardt, and H. Rose, "Design and test of an electric and magnetic dodecapole lens", *Optic 63*, No. 1, 1982, pp. 9-23.
J. Zach, "Design of high-resolution low-voltage scanning electron microscope", *Optc 83*, No. 1, 1989, pp. 30-40.
Joachim Zach, Maximilian Haider, "Aberration correction in a low voltage SEM by a multipole corrector", *Nuclear Instruments and Methods in Physics Research*, A 363, 1995, pp. 316-325.

* cited by examiner

*Primary Examiner*—David A. Vanore
(74) *Attorney, Agent, or Firm*—The Webb Law Firm

(57) ABSTRACT

The present invention provides method and apparatus for automatically correcting aberrations in a charged-particle beam. The apparatus has a memory for storing image data obtained by scanning a specimen with the beam. A four-sided region-blurring device reads the image data from the memory and blurs regions close to the four sides of an image represented by the image data. A probe profile extractor extracts the probe profile from the image that has been blurred as mentioned above. A correction amount-calculating unit performs extraction of amounts of features, calculations of aberrations. A correcting unit corrects the aberration corrector.

3 Claims, 10 Drawing Sheets

METHOD OF AUTOMATICALLY CORRECTING ABERRATIONS IN CHARGED-PARTICLE BEAM AND APPARATUS THEREFOR

BACKGROUND OF THE INVENTION

1. Field of the Invention

The present invention relates to a method of automatically correcting aberrations in a charged-particle beam and to an apparatus therefor.

2. Description of Related Art

In scanning electron microscopes and transmission electron microscopes, an aberration corrector is built in the electron optical system to permit high-resolution imaging and to enhance the probe current density. A system consisting of an aberration corrector having four stages of multipole units has been proposed as the first-mentioned built-in aberration corrector. Each multipole unit has twelve pole elements. Chromatic aberration is corrected by a combination of an electrostatic quadrupole mode of operation and a magnetic quadrupole mode of operation. Spherical aberration is corrected by four stages of octopole mode of operation. The principle is introduced in detail in H. Rose, *Optik* 33, Heft 1, 1–24 (1971); J. Zach, *Optik* 83, No. 1, 30–40 (1989); and J. Zach and M. Haider, *Nucl. Instru. and Meth. In Phys. Res. A* 363, 316–325 (1995).

The principle of the above-described aberration corrector is described briefly with reference to FIG. 9. In FIG. 9, an aberration corrector C is disposed ahead of an objective lens 7 and equipped with four stages of multipole units 51, 52, 53, and 54. Each of the multipole units 51–54 has twelve pole elements. Electric potentials 1, 2, 3, and 4 are applied to the multipole elements 51–54, respectively, to activate the electrostatic quadrupole elements. Exciting currents 5 and 6 are supplied to the second and third stages of multipole units 52 and 53, respectively, to produce magnetic potential distribution analogous to the electric potential distribution created by the potentials 2 and 3 and to produce a magnetic field superimposed on the electric field. Furthermore, electric potentials 11, 12, 13, and 14 are applied to the multipole units 51–54, respectively, to activate an electrostatic octopole element for producing an electric field superimposed on the electric field produced by the potentials 1–4 that are used to activate the quadrupole.

In actual instrumentation, electric fields produced by dipole-activating potential (acting as a deflector for axial alignment) and hexapole-activating potential (acting to correct second-order aperture aberration) are superimposed on the electric fields produced by the quadrupole-activating and octopole-activating potentials. Since these superimposed fields are hardly related directly with aberration correction for which the present invention is intended, they will not be described in detail below.

In the configuration of FIG. 9, with respect to a charged-particle beam B entering from the left side as viewed in the figure, a reference orbit for the beam B is created by the four stages of multipole units 51–54 and objective lens 7. The beam B is focused onto a specimen surface 20. In FIG. 9, X-direction orbit $R_x$ and Y-direction orbit $R_y$ of the beam B are both schematically drawn on the same plane.

The reference orbit can be understood as a paraxial orbit that is assumed when there is no aberration. That is, the Y-direction orbit $R_y$ is made to pass through the center of the multipole unit 52 by the multipole unit 51. The X-direction orbit $R_x$ is made to pass through the center of the multipole unit 53 by the multipole unit 52. Finally, the charged-particle beam B is focused onto the specimen surface 20 by the multipole units 53, 54 and objective lens 7. In practice, these need to be adjusted mutually for complete focusing. At this time, the dipole-activating potentials applied to the four stages of multipole units 51–54 are used for axial alignment.

Referring more particularly to FIG. 9, the charged-particle beam B in the X-direction orbit $R_x$ is diffused by the multipole unit 51 acting like a concave lens. Then, the beam is focused by the multipole unit 52 acting like a convex lens and made to pass through the center of the multipole unit 53. Then, the beam is focused by the multipole unit 54 and moves toward the objective lens 7. On the other hand, the beam B in the Y-direction orbit $R_y$ is focused by the multipole unit 51 and made to pass through the center of the multipole unit 52. Then, the beam is focused by the multipole unit 53. Finally, the beam is diffused by the multipole unit 54 and moves toward the objective lens 7. By combining the diffusive action of the multipole unit 51 acting on the orbit $R_x$ in the X-direction and the diffusive action of the multipole unit 54 acting on the orbit $R_y$ in the Y-direction in this way, the electron optical system can be operated like a single concave or convex lens.

Correction of chromatic aberration in the charged-particle beam B using the aberration corrector C is next described. To correct chromatic aberration in the system shown in FIG. 9, electric potential $\phi_{q2}$ [V] acting as an electrostatic quadrupole element and magnetic excitation $J_2$ [AT] (or magnetic potential) acting as a magnetic quadrupole element are adjusted such that the reference orbit remains unchanged. The whole lens system acts to correct the X-direction chromatic aberration to zero. Similarly, electric potential $\phi_{q3}$ [V] acting as an electrostatic quadrupole element and magnetic excitation $J_3$ [AT] acting as a magnetic quadrupole element are adjusted such that the reference orbit is not affected. The whole lens system acts to correct the Y-direction chromatic aberration to zero.

Correction of spherical aberration (correction of the third-order aperture aberration) in the charged-particle beam B is next described. Spherical aberration is corrected after X- and Y-direction chromatic aberrations are corrected. The X-direction spherical aberration in the whole lens system is corrected to zero by electric potential $\phi_{o2}$ [V] acting as an electrostatic octopole element. The Y-direction spherical aberration is corrected to zero by electric potential $\phi_{o3}$ [V] acting as an electrostatic octopole element.

Then, the spherical aberration in the resultant direction of the X- and Y-directions is corrected to zero by the electric potentials 11 and 14 for activating the electrostatic octopole elements. In practice, repeated mutual adjustments are necessary. Superimposition of the potentials and magnetic excitations for activation of quadrupole and octopole elements has been put into practical use by using a single unit having twelve pole elements and varying the potential or excitation applied to each pole of the twelve pole elements so as to synthesize dipoles, quadrupoles, hexapoles, octopoles, etc. This method has been introduced, for example, in M. Haider et al., *Optik* 63, No. 1, 9–23 (1982).

In particular, in an electrostatic design, a final stage of power supplies $A_n$ (n=1, 2, ..., 12) capable of supplying a voltage to twelve electrodes $U_n$ (n=1, 2, ..., 12) independently is connected as shown in FIG. 10. Where a quadrupole field is produced, output voltages from a quadrupole power supply 10 are supplied to the final-stage power supplies $A_n$ to obtain a field close to an ideal quadrupole field. If it is assumed that the output voltages from the final-stage power supplies $A_n$ are proportional to the output voltages from the quadrupole power supply 10, the ratio of the output voltages from the power supply 10 assumes a value as given in the above-quoted M. Haider et al. reference. Where an octopole field is created to be superimposed on this quadrupole field, output voltages from an octopole power supply 18 are added to the output voltages from the quadrupole power supply 10 and supplied to the final-stage power supplies $A_n$ to obtain a field close to an ideal octopole field. Subsequently, based on a similar concept, a field on which a multipole field produced by operation of a 2n-pole element (n=1, 2, . . . , 6) is superimposed is obtained by activating the twelve poles formed on a single unit.

In a magnetic design, a final stage of power supplies $B_n$ (n=1, 2, . . . , 12) capable of supplying excitation currents to the coils on twelve magnets $W_n$ (n=1, 2, . . . , 12) independently is connected as shown in FIG. 11. Where a magnetic quadrupole field is created, output voltages from a magnetic quadrupole power supply 15 are supplied to the final stage of power supplies $B_n$ to produce a field close to an ideal magnetic quadrupole field. If it is assumed that the output currents from the final-stage power supplies $B_n$ are proportional to the output voltage from the magnetic quadrupole power supply 15, the ratio of the output voltages assumes an exciting magnetic force ratio as given in the above-quoted M. Haider et al. reference. Superimposition of multipole fields other than a magnetic quadrupole field is not explained herein. However, a magnetic multipole field can be superimposed in the same way as in the electrostatic design, by adding voltages for multipole fields to the input voltage to the final-stage power supplies $B_n$. A yoke for magnetically connecting the outside portions of the magnets $W_n$ is omitted in FIG. 11.

When electrostatic and magnetic designs are superimposed, a conductive magnetic material may be used so that the magnets $W_n$ can act also as the electrodes $U_n$. In this case, the coils on the magnets are disposed so as to be electrically isolated from the electrodes.

In the description given below, the 2n-pole elements are treated as if they were stacked on top of each other to simplify the explanation. In practice, superimposition of plural multipole fields on a dodecapole (12-pole) element mounted on a single unit is achieved by adding voltage signals as mentioned previously.

After end of correction of chromatic aberration in the charged-particle beam B, it may be necessary to correct the second-order aperture aberration by means of three or four stages of hexapole elements before the correction of spherical aberration is performed. This correction is made in the same procedure as in the aforementioned correction of spherical aberration. This second-order aperture aberration occurs depending on the mechanical accuracy of the aberration corrector. Normally, the amount of correction is small, and this aberration affects higher-order aberrations only a little within the scope of the present aberration corrector. Furthermore, the second-order aperture aberration is corrected within the aberration corrector. If the resultant magnification (described later) of the aberration corrector and the objective lens is varied, higher-order aberrations are affected little, though the resultant magnification is important in aberration correction. For these reasons, description of the correction of the second-order aperture aberration is omitted in the description of the prior art.

A method of detecting geometric optics aberrations up to the third order using a probe, especially in a scanning microscope equipped with a point light source, lenses, an object, and a detector, is known, for example, as described in Unexamined Japan Patent Number P2003-521801 (paragraphs 0006–0008, FIG. 1).

The aforementioned procedure of the prior art correction of aberrations in a charged-particle beam is complex. There is the problem that it takes a considerable time for an ordinary operator to master the technique and obtain high-resolution images.

SUMMARY OF THE INVENTION

In view of the foregoing, the present invention has been made. It is an object of the present invention to provide a method and apparatus permitting an operator to automatically and easily correct aberrations in a charged-particle beam unconsciously of a complex procedure of aberration correction.

A method of automatically correcting aberrations in a charged-particle beam in accordance with the present invention comprises the steps of: storing image data obtained by scanning a specimen with the charged-particle beam into a memory; reading the image data from the memory and blurring regions close to four sides of an image represented by the image data; extracting the profile of a probe from the image blurred by the immediately preceding step; extracting line profiles from the extracted probe profile; performing extraction of amounts of features, calculations of aberrations, judgments on corrections of the aberrations, and setting of an amount of feedback about the obtained line profiles; and correcting conditions under which an aberration corrector is driven, based on the obtained amount of feedback.

An apparatus for automatically correcting aberrations in a charged-particle beam in accordance with the present invention comprises: an aberration corrector for correcting the aberrations in the charged-particle beam; a memory for storing image data obtained by scanning a specimen with the charged-particle beam; a four-sided region-blurring device for reading the image data from the memory and blurring regions close to four sides of an image represented by the image data; a probe profile extractor for extracting a probe profile from the image blurred by the four-sided region-blurring device; a line profile extractor for extracting line profiles from the extracted probe profile; correction amount-calculating means for performing extraction of amounts of features, calculation of aberrations, judgments on corrections of the aberrations, and setting of an amount of feedback about the extracted line profiles; and correcting means for correcting conditions under which the aberration corrector is driven, based on the amount of feedback obtained by the correction amount-calculating means.

According to the method of automatically correcting aberrations in a charged-particle beam in accordance with the present invention, processing for blurring regions close to the four sides is performed on the image data obtained by making a scan with the beam. Therefore, artifacts produced at peripheries of the obtained image can be removed. Consequently, the profile of the probe can be found precisely. The amounts of corrections to the aberrations in the charged-particle beam can be calculated based on the profile of the probe. Consequently, the amounts of corrections to the aberrations in the beam can be computed precisely. Hence, the operator can automatically and easily correct the aberrations unconsciously of a complex procedure.

According to the apparatus for automatically correcting aberrations in a charged-particle beam in accordance with the present invention, processing for blurring regions close to four sides is performed on image data obtained by scanning a specimen with the beam. As a result, artifacts produced at peripheries of the obtained image can be removed. Consequently, the profile of the probe can be found precisely. Based on this probe profile, the amounts of corrections to the aberrations in the beam can be calculated by the correction amount-calculating means. Consequently, the amounts of corrections to the aberrations in the beam can be computed precisely. The operator can automatically and easily correct the aberrations unconsciously of a complex procedure.

Other objects and features of the present invention will appear in the course of the description thereof, which follows.

DESCRIPTION OF THE PREFERRED EMBODIMENTS

Preferred embodiments of the present invention are hereinafter described in detail with reference to the accompanying drawings.

Figure 1:
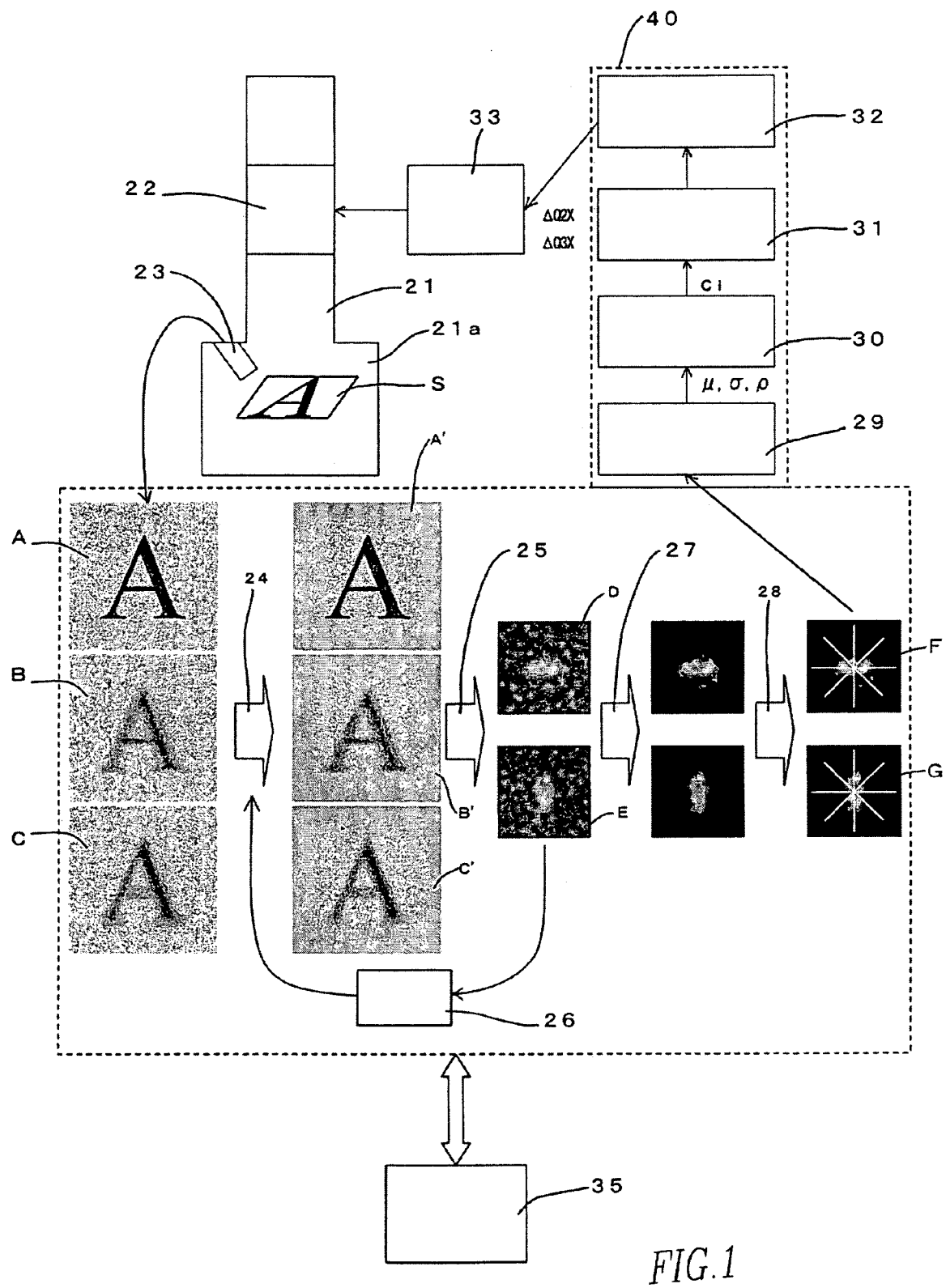
FIG. 1 is a diagram showing one embodiment of the present invention.
Figure 9:
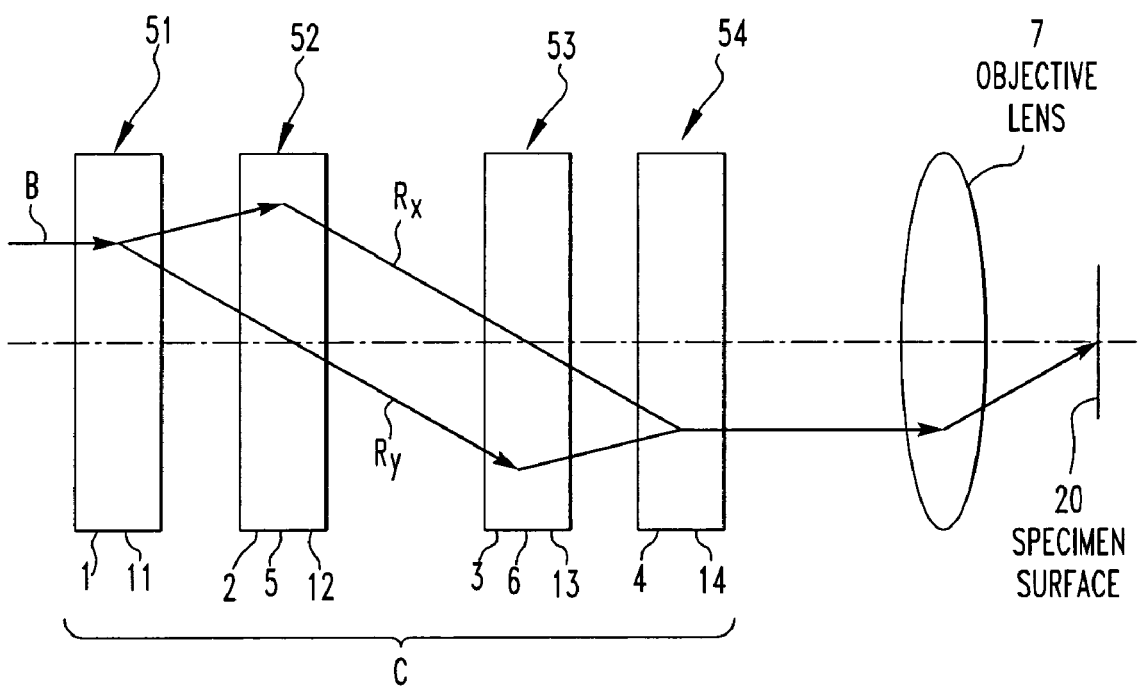
FIG. 9 is a diagram illustrating the principle of operation of the aberration corrector.
Figure 10:
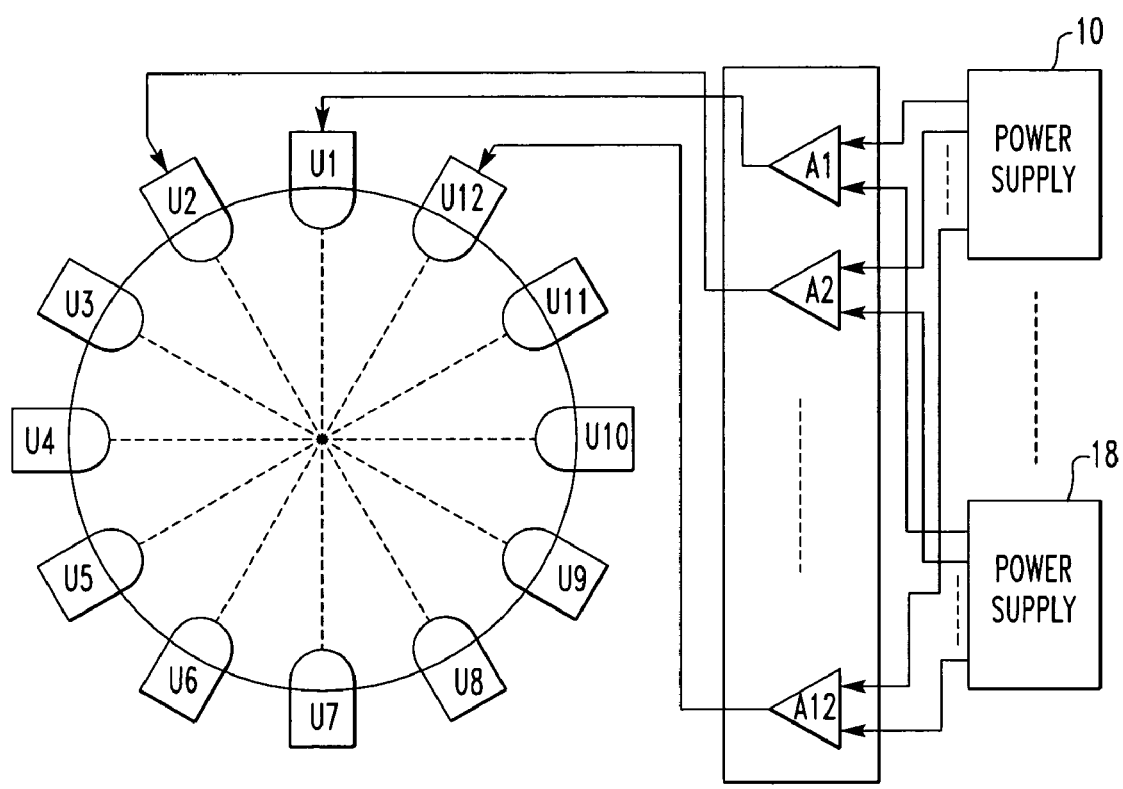
FIG. 10 is a diagram illustrating a method using an electrostatic dodecapole element as an electrostatic multipole element having less than twelve poles.
Figure 11:
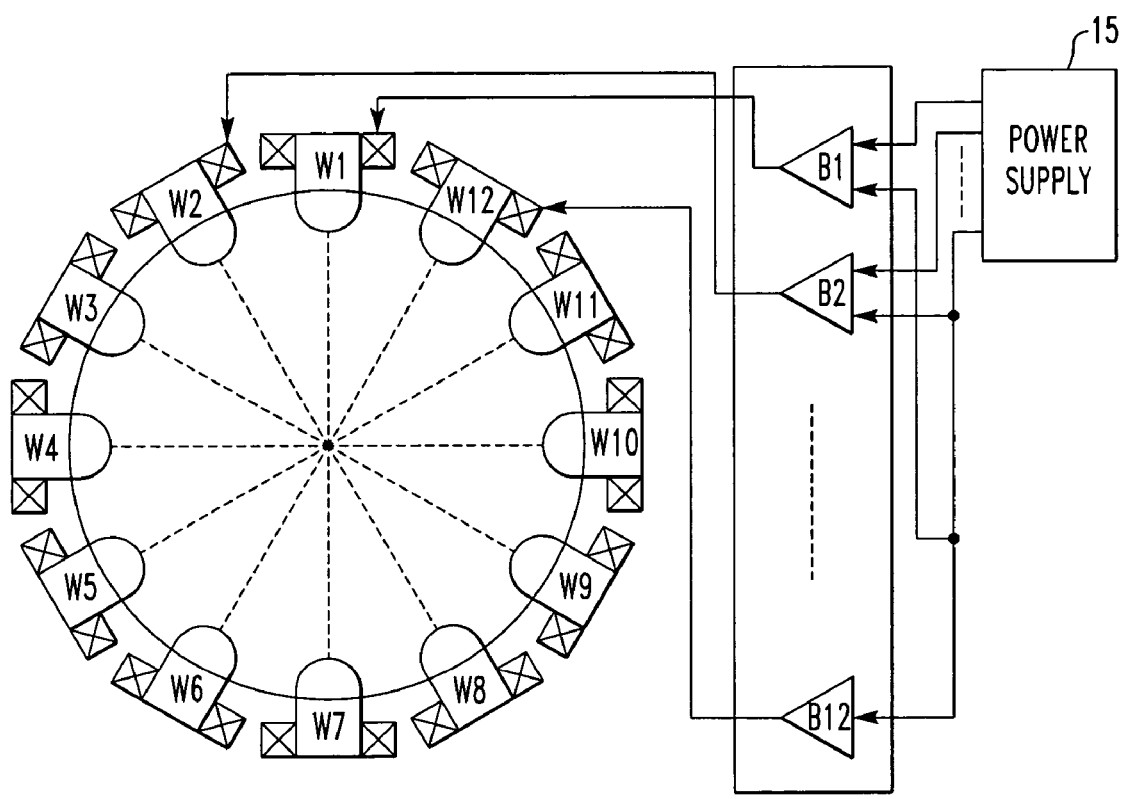
FIG. 11 is a method of illustrating a method using a magnetic dodecapole element as a magnetic multipole element having less than twelve magnetic poles.

FIG. 1 shows the configuration of one embodiment of the present invention. In FIG. 1, indicated by numeral 21 is the body of an apparatus having the configuration of an SEM. An aberration corrector 22 is mounted in the body 21 of the apparatus. The corrector 22 is designed as shown in FIG. 9. The body 21 of the apparatus has a specimen chamber 21a in which a specimen S is placed. A character "A" as shown is formed on the surface of the specimen S. The specimen S is irradiated with an electron beam that is one kind of charged-particle beam. As a result, secondary electrons and other electrons are emitted from the surface of the specimen S. The secondary electrons are detected by a detector 23. A to C show specimen images detected by the detector 23. The image A is obtained when the beam is accurately focused. The image B is obtained when the beam is underfocused. The image C is obtained when the beam is overfocused.

Figure 2:
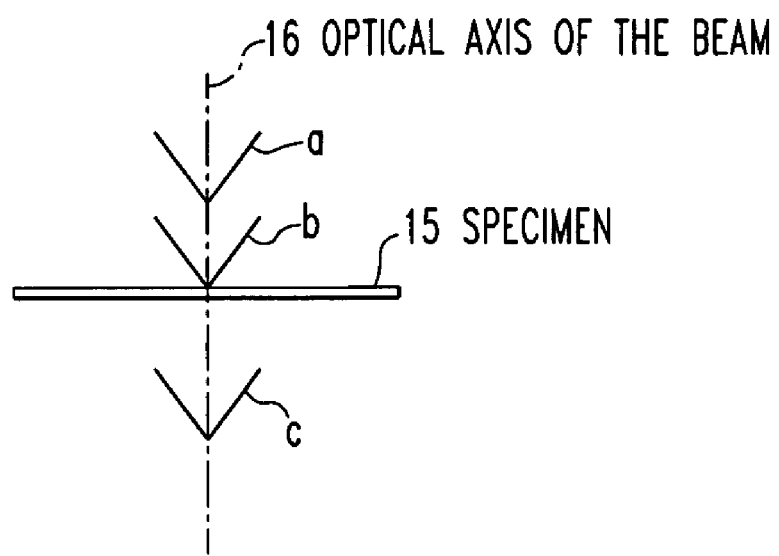
FIG. 2 shows the manner in which a beam is focused onto a specimen.

FIG. 2 shows the state in which the electron beam is focused onto a specimen. In this figure, the specimen is indicated by numeral 15. The optical axis of the beam is indicated by 16. In FIG. 2, a indicates the state in which the beam is focused above the specimen 15, b indicates the state in which the beam is focused onto a surface of the specimen 15, and c indicates the state in which the beam is focused under the surface of the specimen 15. In the state a, the beam is excessively restricted by a lens and so the beam is focused above the surface of the specimen 15. Hence, this is an overfocused condition. In the state b, the beam is accurately focused onto the surface of the specimen 15. In the state c, the beam is insufficiently restricted, so that the beam is focused under the surface of the specimen 15. This is an underfocused condition. In the case of the image b, the image is blurred laterally. In the case of the image C, the image is blurred vertically.

The image detected by the detector 23 is converted into a digital image and then stored in a memory 35. A four-sided region-blurring device 24 reads each image stored in the memory 35 and blurs regions close to the four sides of the image. The probe profile extractor 25 receives the output from the blurring device 24 and extracts the profile of each probe. A', B', and C' are images respectively obtained after the images A, B, and C have passed through the blurring device 24. An S/N adjuster 26 adjusts the S/N of the image extracted by the probe profile extractor 25 and reduces the noise. The output from the S/N adjuster 26 is fed back to the four-sided region-blurring device 24, where the background noise is removed. In the figure, D indicates the cross-sectional shape of the electron probe when the beam is underfocused, and E indicates the cross-sectional shape of the probe when the beam is overfocused. The cross-sectional shape of the electron probe may hereinafter be referred to as the profile of the probe.

A noise remover 27 receives the output from the probe profile extractor 25 and removes the noise. A line profile extractor 28 sets lines as shown for the probe profile from which the noise has been removed, and extracts line profiles in the directions of the lines. F indicates the state in which the lines are set for an underfocused probe. G indicates the state in which the lines are set for an overfocused probe.

Each line profile is entered into the correction amount-calculating means 40, where the "amount of correction to aberration" is computed. A corrector power supply 33 adds the "amount of correction to aberration" to the aberration corrector 22 based on the amount of correction computed by the calculating means 40.

In the correction amount-calculating means 40, a line profile feature amount-extracting device 29 receives the output from the line profile extractor 28 and extracts the amount of features of the line profile. The amount of features consists of $\mu$ indicating the left-and-right asymmetry of the line profile, $\sigma$ indicating the width of the line profile, and $\rho$ indicating the unevenness around the center of the line profile. An aberration calculator 30 receives the output from the line profile feature amount-extracting device 29 and calculates parameters $C_i$'s indicating aberrations (where i is an integer). An aberration corrector decision-making device 31 receives the output from the aberration calculator 30 and makes a decision as to whether there still remains aberration to be corrected. A feedback amount-setting device 32 receives the output from the decision-making device 31 and sets an amount of feedback to reduce the aberration. The corrector power supply 33 receives the output from the setting device 32 and produces an output that drives the aberration corrector 22. A memory 35 stores specimen images taken in. For example, a magnetic disk drive is used as this memory 35. The operation of the apparatus constructed in this way is described below.

In FIG. 1, the electron beam emitted from an electron gun (not shown) passes through the aberration corrector 22. At this time, the beam undergoes an aberration correction and is focused on the specimen S. Secondary electrons or backscattered electrons produced from the surface of the specimen are detected by the detector 23. Then, the output signal from the detector 23 is converted into digital image data by an A/D converter (not shown) and then stored in the memory 35. Each image stored in the memory 35 can take one of three states; one (b) is precisely focused state of the electron beam as shown in FIG. 2, another (c) is an underfocused state, and the remaining one (a) is an overfocused state.

The image data stored in the memory 35 is read out and then enters the four-sided region-blurring device 24, where artifacts around the four sides of the image are removed. The images blurred in this way by the four-sided region-blurring device 24 are indicated by A', B', and C', respectively. Then, the probe profile extractor 25 extracts the probe profile. Examples of probes whose profiles have been extracted by the extracting device 25 are indicated by D and E. D indicates the profile obtained in an underfocused state. E indicates the profile obtained in an overfocused state. The image of the profile of each probe is automatically adjusted by the S/N adjuster 26 and fed back to the four-sided region-blurring device 24. In consequence, the average size of background noises contained in the probe profile can be reduced to a minimum.

Figure 3:
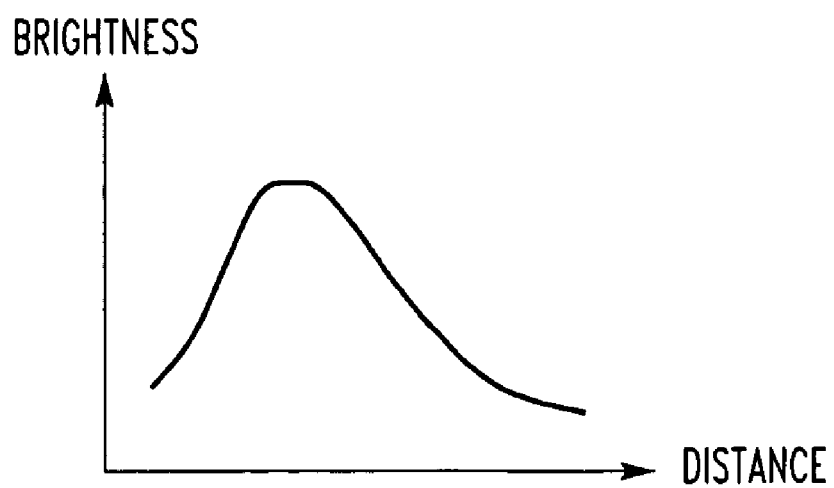
FIG. 3 is a graph showing one example of line profile.

After the noises in the image of the probe profile have been removed by the noise remover 27, the image enters the line profile extractor 28, where profiles based on plural lines are extracted as indicated by F and G. FIG. 3 shows one example of the line profile obtained in this way. In this graph of FIG. 3, the horizontal axis indicates distance, while the vertical axis indicates brightness. The obtained line profile is passed into the following line profile feature amount-extracting device 29, where the parameters μ, σ, and ρ indicative of the features of the line profile are extracted. The aberration calculator 30 enters these parameters, or amounts of features, μ, σ, and ρ and computes a parameter $C_i$ (where i is an integer) used as a measure indicating each aberration.

The output from the aberration calculator 30 enters the aberration correction decision-making device 31, which receives the outputs $C_i$'s from the aberration calculator 30 and makes a decision as to whether there still remains aberration to be corrected. The feedback amount-setting device 32 finds a field to be applied to the aberration corrector 22 to correct the aberration specified by the aberration correction decision-making device 31 out of the outputs $C_i$'s from the aberration calculator 30. Amounts of correction $\Delta Q2x$ and $\Delta Q3x$ output from the feedback amount-setting device 32 are entered into the corrector power supply 33. This power supply 33 applies voltages for correcting the aberration corrector 22 according to the amounts of correction to the aberration corrector 22. As a result, the corrector 22 corrects the aberrations in the electron beam. Consequently, the beam free of aberrations can be directed at the specimen S.

As mentioned previously, according to the present invention, the amount of feedback to be applied to the aberration corrector is automatically calculated in order to correct the aberrations in the electron beam. Consequently, the operator can automatically correct the conditions under which the aberration corrector is driven unconsciously of a complex procedure. Aberrations in the beam can be corrected easily and automatically.

The operations of the aforementioned components are described in detail below.

(a) Four-Sided Region-Blurring Device

The values of the pixels of an image are passed through a filter that acts to vary the values of the pixels in such a way that the values of pixels located closer to any one of the four sides of the image are made closer to a constant value. Thus, image regions close to the four sides are blurred. For example, it is now assumed that the image regions close to the four sides of a two-dimensional image $a_{ij}$ (i=0, 1, ..., m−1; j=0, 1, ..., n−1) consisting of m pixels (horizontal)×n pixels (vertical) are blurred by an amount almost equal to $\sigma_{edge}$ pixels. We now introduce the relation

[Mathematical Formula 1]

$$\bar{a} = \frac{1}{mn}\sum_{i,j} a_{ij}$$

A conceivable method is to make the value of the (i,j)th pixel equal to the value given by the following equation:

[Mathematical Formula 2]

$$\bar{a} + (a_{i,j} - \bar{a})\left(1 - \exp\left[-\frac{1}{2}\left(\frac{i+0.5}{\sigma_{edge}}\right)^2\right]\right)\left(1 - \exp\left[-\frac{1}{2}\left(\frac{j+0.5}{\sigma_{edge}}\right)^2\right]\right) \times \\ \left(1 - \exp\left[-\frac{1}{2}\left(\frac{m-i-0.5}{\sigma_{edge}}\right)^2\right]\right)\left(1 - \exp\left[-\frac{1}{2}\left(\frac{n-j-0.5}{\sigma_{edge}}\right)^2\right]\right) \quad (1)$$

Figure 4:
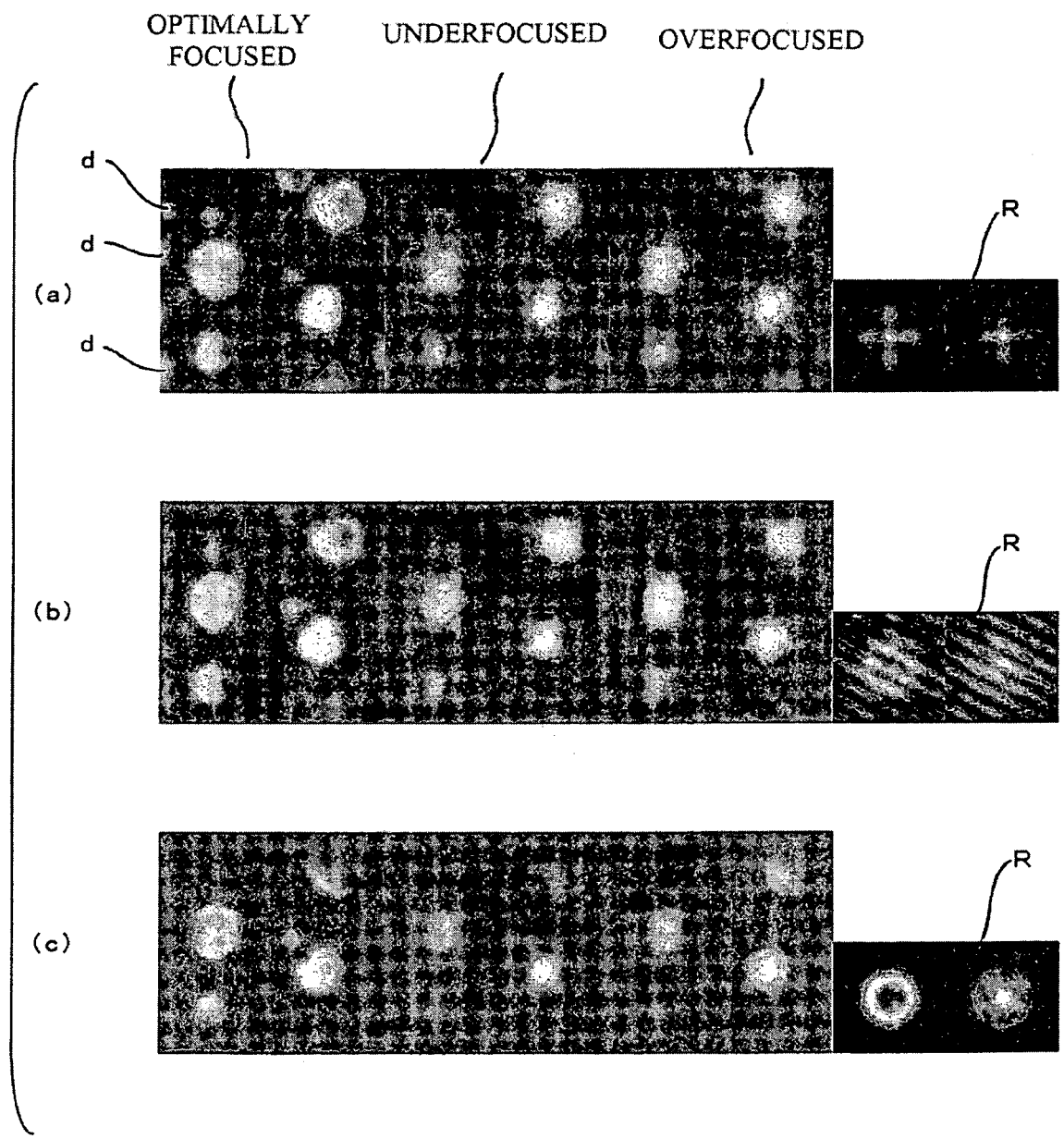
FIG. 4 illustrates the manner in which artifacts are removed by blurring of regions close to four sides.

FIG. 4 illustrates the manner in which artifacts are removed by blurring of the regions close to the four sides, and shows gray scale images of one example of main image displayed on the viewing screen on a display device in accordance with one embodiment of the present invention. In (a), image regions close to the four sides are not blurred. In (b), the image regions close to the four sides have been slightly blurred. In (c), the image regions close to the four sides have been appropriately blurred. In each case, the left image is obtained when the beam is optimally focused. The middle image is obtained when the beam is underfocused. The right image is obtained when the beam is overfocused. Furthermore, in these cases (a)–(c), R indicates the profile of each probe.

In (a) obtained when the beam is optimally focused, image segments d existing in the regions close to the four sides are artifacts. The image segments d are not conspicuous when the beam is underfocused or overfocused. At this time, the probe profile assumes a crisscross form not because of aberration in the charged-particle beam. Rather, it is caused by the artifacts d which are present in the image regions close to the four sides of the image and are interrupted at the ends of the image and thus are left behind partially. It can be seen that when the regions close to the four sides are slightly blurred as shown in (b), the artifacts are considerably removed. At this time, the probe profile is rounder than in the case of (a) but there are oblique stripes. When the regions close to the four regions are optimally blurred as shown in (c), the artifacts are removed greatly. The probe profile has been rounded. Consequently, it can be seen that an improvement has been achieved.

Another method of blurring the image regions close to the four sides is next described. Peripheral regions of a two-dimensional image $a_{ij}$ (i=0, 1, ..., m−1; j=0, 1, ..., n−1)

consisting of m pixels (horizontal)×n pixels (vertical) are blurred such that the values of the (i,j)th pixel are given by:

[Mathematical Formula 3]

$$\tilde{a}_{ij}$$

1.

[Mathematical Formula 4]

$$\tilde{a}_{ij}$$

is found, for example, by

[Mathematical Formula 6]

$$\tilde{a}_{ij} = \bar{a} + (a_{ij} - \bar{a})\left(1 - \left[1 + \frac{1}{\nu}\left(\frac{i+0.5}{\sigma_x}\right)^\alpha\right]^{-\frac{\nu+1}{2}}\right) \quad (2)$$

$$\left(1 - \left[1 + \frac{1}{\nu}\left(\frac{j+0.5}{\sigma_y}\right)^\alpha\right]^{-\frac{\nu+1}{2}}\right) \times$$

$$\left(1 - \left[1 + \frac{1}{\nu}\left(\frac{m-i-0.5}{\sigma_x}\right)^\alpha\right]^{-\frac{\nu+1}{2}}\right)$$

$$\left(1 - \left[1 + \frac{1}{\nu}\left(\frac{n-j-0.5}{\sigma_y}\right)^\alpha\right]^{-\frac{\nu+1}{2}}\right)$$

where

[Mathematical Formula 5]

$$\bar{a}$$

is an arbitrary real number, and $\sigma_x$, $\sigma_y$, $\nu$, and $\alpha$ are arbitrary positive real numbers. At this time, the amount of blurring is adjusted with $\sigma_x$ and $\sigma_y$.

2. In Equation (2), the following equation is established:

[Mathematical Formula 7]

$$\bar{a}=0$$

3. In Equation (2), the following equation is introduced:

[Mathematical Formula 8]

$$\bar{a} = \frac{1}{mn}\sum a_{ij}$$

4. In Equation (2), the relation $\sigma_x=\sigma_y$ is established.
5. In Equation (2), the relation $\nu=1$ is established.
6. In Equation (2), the relation $\nu\to\infty$ is established.

That is, we obtain:

[Mathematical Formula 9]

$$\tilde{a}_{ij} = \bar{a} + (a_{ij} - \bar{a})\left(1 - \exp\left[-\frac{1}{2}\left(\frac{i+0.5}{\sigma_x}\right)^\alpha\right]\right) \quad (3)$$

$$\left(1 - \exp\left[-\frac{1}{2}\left(\frac{j+0.5}{\sigma_y}\right)^\alpha\right]\right) \times \left(1 - \exp\left[-\frac{1}{2}\left(\frac{m-i-0.5}{\sigma_x}\right)^\alpha\right]\right)$$

$$\left(1 - \exp\left[-\frac{1}{2}\left(\frac{n-j-0.5}{\sigma_y}\right)^\alpha\right]\right)$$

7. In Equation (2), the relation $\alpha=2$ is established.
8. Assuming that

[Mathematical Formula 10]

$$\bar{a}$$

is an arbitrary real number and $\sigma_x$, $\sigma_y$, $\nu$, $\alpha$ a are arbitrary positive real numbers, we introduce:

[Mathematical Formula 11]

$$\tilde{a}_{ij} = \bar{a} + (a_{ij} - \bar{a})\left[1 + \frac{1}{\nu}\left|\frac{i+0.5-m/2}{\sigma_x}\right|^\alpha\right]^{-\frac{\nu+1}{2}} \quad (4)$$

$$\left[1 + \frac{1}{\nu}\left|\frac{j+0.5-n/2}{\sigma_y}\right|^\alpha\right]^{-\frac{\nu+1}{2}}$$

In this case, the amount of blurring is adjusted with $\sigma_x$ and $\sigma_y$.

9. In Equation (4), we establish:

[Mathematical Formula 12]

$$\bar{a}=0$$

10. In Equation (4), we establish:

[Mathematical Formula 13]

$$\bar{a} = \frac{1}{mn}\sum_{i,j} a_{ij}$$

11. In Equation (4), the relation $\sigma x=\sigma y$ is established.
12. In Equation (4), the relation $\sigma x:\sigma y=m:n$ is established.
13. In Equation (4), the relation $\nu=1$ is established.
14. In Equation (4), the relation $\nu\to\infty$ is established.

That is,

[Mathematical Formula 14]

$$\tilde{a}_{ij} = \bar{a} + (a_{ij} - \bar{a})\exp\left[-\frac{1}{2}\left|\frac{i+0.5-m/2}{\sigma_x}\right|^\alpha\right] \quad (5)$$

$$\exp\left[-\frac{1}{2}\left|\frac{j+0.5-n/2}{\sigma_y}\right|^\alpha\right]$$

15. In Equation (4), the relation $\alpha=2$ is established.

The regions close to the four sides can be blurred by adjusting the parameters in this way.

(b) Probe Profile Extractor

The case of underfocusing is taken as an example. An underfocused image is Fourier-transformed. The result is divided by the Fourier transform of the optimally focused image and multiplied by the inverse Fourier transform of the probe profile when the beam is optimally focused. Then, the result is Fourier-transformed. Thus, the probe profile in an underfocused state is found. In particular, when the probe profile is extracted when the beam is underfocused, optimally focused and underfocused images are used. The probe profile obtained when the beam is optimally focused is sufficiently smaller than the probe profile when the beam is underfocused. Therefore, it is not necessary to know the profile in detail. Specifically, a Gaussian distribution of a width that is experimentally found using the resolution as a measure will suffice. When the beam is overfocused, the probe profile is found similarly.

(c) S/N Adjuster

Plural values of the amount by which the regions close to the four sides are blurred in (a) are attempted. The probe profile is found as in (b) about each of the values. The average size $\epsilon$ of background noises contained in the probe profile is found. The probe profile that minimizes the size $\epsilon$ is adopted. For example, the root mean square of pixels having sizes less than $\alpha$ times the maximum value is used as the average size $\epsilon$, where $\alpha$ is an experimentally found parameter.

(d) Noise Remover

This is used to remove background noise contained in the probe profile found in (c). The method is implemented as follows, for example.

The root mean square of pixels having sizes less than $\alpha$ times the maximum value is set to $\epsilon$. The center of gravity of a set of pixels having sizes exceeding $\alpha$ times the maximum value is given by $(i_g, j_g)$. The inside of a region whose center is located at $(i_g, j_g)$ and which has a radius of r pixels is now considered. Pixels having sizes of more than $\beta$ times the $\epsilon$ out of pixels adjacent to the region are added to the region, forming a new region. Pixels having sizes of more than $\beta$ times the size $\epsilon$ and adjacent to the new region are also added. In this way, pixels are successively added. The values of pixels not contained in the finally formed region are set to 0.

Pixels which are located within the region and have negative values (and thus pixels of low brightness) are also set to 0. $\alpha$ and $\beta$ are experimentally found parameters. $\alpha$ has a size of about 0.3. $\beta$ has a size of about 2.

(e) Line Profile Extractor

Probe profiles which have been obtained when the beam is underfocused and overfocused, respectively, and from which noises have been removed in (d) are each represented by a two-dimensional image having m pixels (horizontal) and n pixels (vertical). The two-dimensional images are respectively given by $p_{u,ij}$ and $p_{o,ij}$ (i=0, 1, ..., m−1; j=0, 1, ..., n−1). The center of gravity of $p_{u,ij}$ is given by

[Mathematical Formula 15]

$$(i_g, j_g) = \frac{\sum_{i,j}(i,j)p_{u,ij}}{\sum_{i,j}p_{u,ij}}$$

The center of gravity of $p_{u,ij}$ is used as the center. N line profiles are taken at regular intervals and given by $f_{u,kl}$ (k=0, 1, ..., N−1; l=0±1, ±2, ...). Note that l=0 corresponds to the position of the center of gravity. In $f_{u,kl}$, u indicates underfocusing, k indicates direction, and l indicates position. In the case of overfocusing, line profiles of $p_{o,ij}$ are similarly taken and given by $f_{o,kl}$.

(f) Line Profile Feature Amount Extractor

The following amounts are found from the line profile $f_{u,kl}$ found in (e):

[Mathematical Formulas 16]

$$S_{u,k} = \sum_l f_{u,kl} \quad (6)$$

$$T_{u,k} = \sum_l f_{u,kl}^2 \quad (7)$$

$$\mu_{u,k} = \frac{1}{S_{u,k}} \sum_l l \cdot f_{u,kl} \quad (8)$$

$$\sigma_{u,k} = \sqrt{\frac{1}{S_{u,k}} \sum_l l^2 \cdot f_{u,kl}} \quad (9)$$

$$\rho_{u,k} = \frac{\sigma_{u,k}^2}{T_{u,k}} \sum_{\substack{l \\ (l \neq 0)}} \frac{1}{|l|}(f_{u,kl} - f_{u,k0}) \cdot f_{u,kl} \quad (10)$$

where $\mu_{u,kl}$, $\sigma_{u,kl}$, and $\rho_{u,kl}$ are parameters indicating the amounts of features of the line profiles. $\mu_{u,kl}$ indicates left-and-right asymmetry. $\sigma_{u,kl}$ indicates the width. $p_{u,kl}$ indicates unevenness around the center. An example of line profile has been shown in FIG. 3. $S_{o,k}$, $T_{o,k}$, $\mu_{o,k}$, $\sigma_{o,k}$, and $\rho_{o,k}$ are similarly computed using line profiles $f_{o,kl}$ occurring when the beam is overfocused.

(g) Aberration Calculator

The following amounts of aberrations (parameters) $C_0$ to $C_{11}$ for the various aberrations are found from the amounts of features $\mu$, $\sigma$, and $\rho$ of the line profiles found in (f), and are used as measures of the aberrations.

[Mathematical Formulas 17]

$$C_0 = \frac{2}{N}\sum_k (\mu_{u,k} + \mu_{o,k})\cos\theta_k \quad \text{(x-coma)} \quad (11)$$

$$C_1 = \frac{2}{N}\sum_k (\mu_{u,k} + \mu_{o,k})\sin\theta_k \quad \text{(y-coma)} \quad (12)$$

$$C_2 = \frac{2}{N}\sum_k (\mu_{u,k} + \mu_{o,k})\cos3\theta_k \quad \text{(x-triangle)} \quad (13)$$

$$C_3 = \frac{2}{N}\sum_k (\mu_{u,k} + \mu_{o,k})\sin3\theta_k \quad \text{(y-triangle)} \quad (14)$$

$$C_4 = \frac{1}{N}\sum_k (\sigma_{u,k} - \sigma_{o,k}) \quad \text{(defocus)} \quad (15)$$

$$C_5 = \frac{2}{N}\sum_k (\sigma_{u,k} - \sigma_{o,k})\cos2\theta_k \quad \text{(xy-astigmatism)} \quad (16)$$

$$C_6 = \frac{2}{N}\sum_k (\sigma_{u,k} - \sigma_{o,k})\sin2\theta_k \quad \text{(45°-astigmatism)} \quad (17)$$

$$C_7 = \frac{2}{N}\sum_k (\sigma_{u,k} - \sigma_{o,k})\cos4\theta_k \quad \text{(cos-4-fold)} \quad (18)$$

$$C_8 = \frac{2}{N}\sum_k (\sigma_{u,k} - \sigma_{o,k})\sin4\theta_k \quad \text{(sin-4-fold)} \quad (19)$$

$$C_9 = \frac{1}{N}\sum_k (\rho_{u,k} - \rho_{o,k}) \quad \text{(spherical)} \quad (20)$$

$$C_{10} = \frac{2}{N}\sum_k (\rho_{u,k} - \rho_{o,k})\cos2\theta_k \quad \text{(xy-star)} \quad (21)$$

$$C_{11} = \frac{2}{N}\sum_k (\rho_{u,k} - \rho_{o,k})\sin2\theta_k \quad \text{(45°-star)} \quad (22)$$

It can be seen from Equations (11)–(22) that calculations are performed using the amounts of features $\mu$, $\sigma$, and $\rho$ occurring when the beam is overfocused and underfocused.

Figure 5:
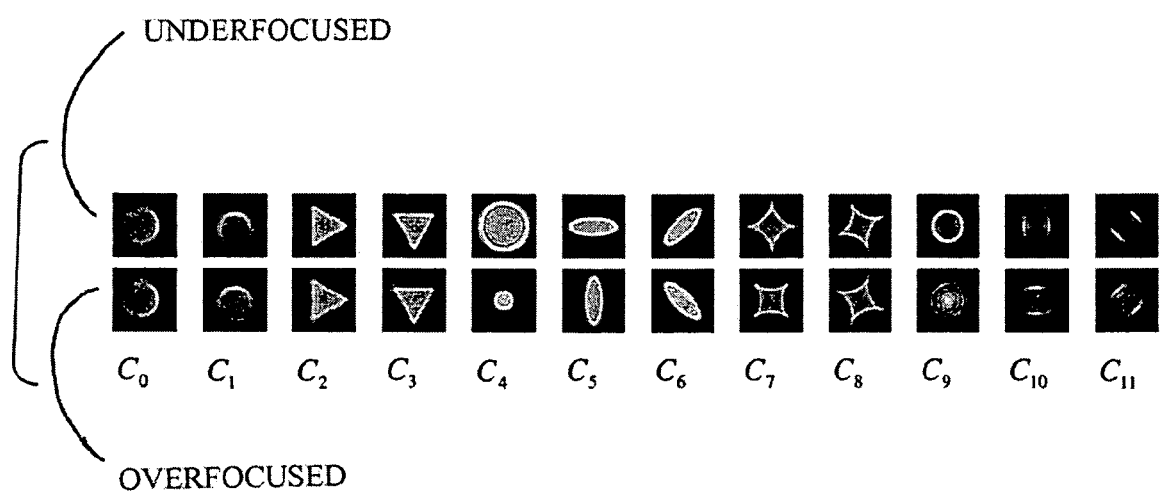
FIG. 5 shows gray scale images showing examples of parameters $C_i$'s on the display screen of a display device in accordance with one embodiment of the present invention.

It is to be noted that the assumption $\theta_k=\pi \cdot k/N$ has been made. Typical probe profiles when there are aberrations which make positive $C_0$ to $C_{11}$ and the beam is underfocused or overfocused are shown in FIG. 5, which shows gray scale images of examples of probe profiles for various kinds of aberrations displayed on a display in accordance with one embodiment of the present invention. The upper images were taken when the beam was underfocused. The lower images were taken when the beam was overfocused.

(h) Aberration Correction Decision-Making Device

The aberration correction decision-making device 31 makes a decision as to whether there still remains aberration to be corrected. For example, the value of Mathematical Formula 18 is found:

[Mathematical Formula 18]

$$C = \sqrt{\frac{\sum_{i=0}^{11} W_i C_i^2}{\sum_{i=0}^{11} W_i}}$$

If the relation $C<\delta$ holds, the adjustment of the aberration correction is ended. In the above equation, $W_i$ is the weight of each aberration about the decision criterion as to whether convergence has been achieved, and $\delta$ is an allowable total amount of aberration.

The aberration correction decision-making device 31 makes a decision to which aberration should priorly be placed in making a correction. Each aberration can be independently quantified. However, when some aberration appears very conspicuously, there is the possibility that the accuracy of quantification of other aberrations deteriorates. Especially, $C_9$, $C_{10}$, and $C_{11}$ have the same symmetry as $C_4$, $C_5$, and $C_6$, respectively, but are higher-order aberrations than the latter aberrations. Therefore, when $C_4$, $C_5$, and $C_6$ appear in large amounts, there is the possibility that the accuracy of quantification of $C_9$, $C_{10}$, and $C_{11}$ deteriorates. To prevent this, a threshold value $\delta_i$ is found about each individual amount of aberration $C_i$. If the threshold value is exceeded, only the corresponding aberration can be corrected.

(i) Feedback Amount-Setting Device

Figure 6:
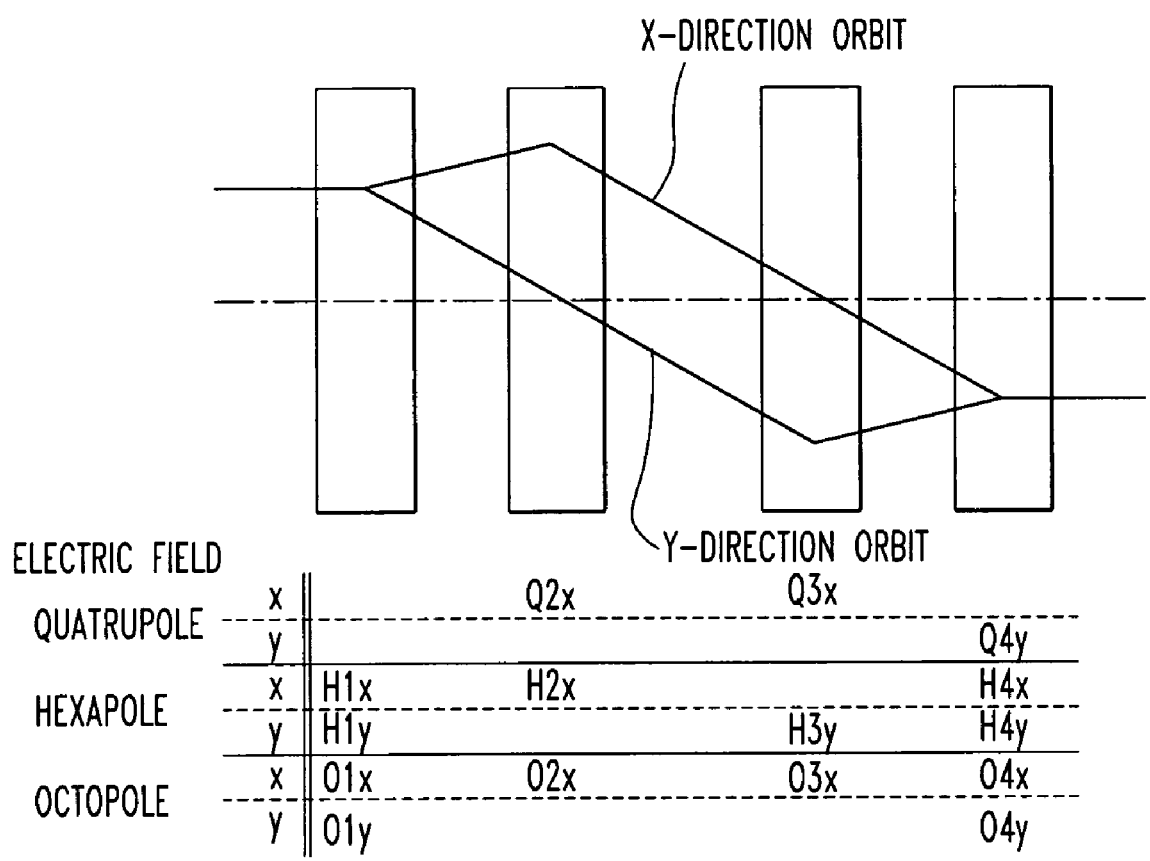
FIG. 6 is a diagram showing one example of aberration corrector.

A field to be applied to the aberration corrector 22 to correct the aberration specified by the aberration correction decision-making device 31 out of the outputs $C_0$ to $C_{11}$ from the aberration calculator 30 is found. As an example, as shown in FIG. 6, a case is discussed in which an aberration corrector equipped with four stages of electrodes or magnetic poles produces an x-direction line image in the second stage and a y-direction line image in the third stage.

Electric quadrupole, hexapole, and octopole fields can be superimposed on each electrode, in addition to the field for creating the first-order orbit as described above. These fields are represented, using symbols Q1x to Q4x, Q1y to Q4y, H1x to H4x, H1y to H4y, O1x to O4x, and O1y to O4y, where Q, H, and O represent electric quadrupole, hexapole, and octopole fields, respectively. The symbols 1 to 4 indicate what of the four stages of electrodes as counted from the first stage. The symbols x and y indicate normal and skew multipole elements, respectively.

The normal multipole element referred to herein is a field in which variation of potential around the axis is cos Mθ. The skew multipole element is a field in which variation of potential around the axis is sin Mθ. M is an integer indicating the kind of the multipole element, and 2M is the number of the poles. θ is the angle around the axis. In this way, according to the present invention, aberrations in the electron beam can be automatically corrected, using the aberration corrector having the four stages of electrodes or magnetic poles.

Figure 7:
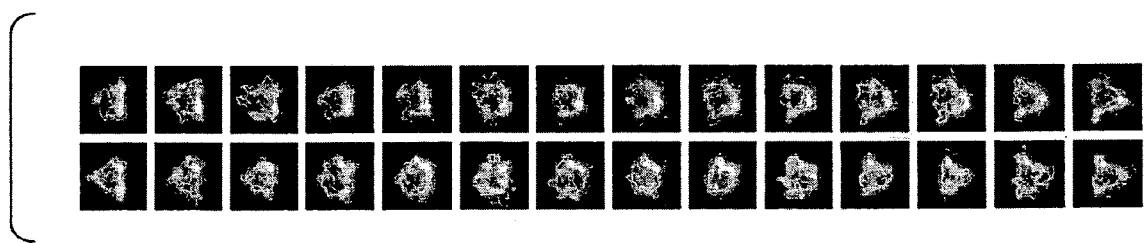
FIG. 7 shows gray scale images showing the profile of a probe on the display screen of a device in accordance with one embodiment of the present invention, showing variations in the profile of the probe when the hexapole field is varied by the aberration corrector.

FIG. 7 shows variations in probe profile when the hexapole field is varied with the aberration corrector. FIG. 7 shows gray scale images of probe profiles within picture images displayed on a display device in accordance with one embodiment of the present invention. As a specific example, variations in probe profile when H1x and H4x were varied at a ratio of H1x:H4x=−1:1 were found experimentally.

Figure 8:
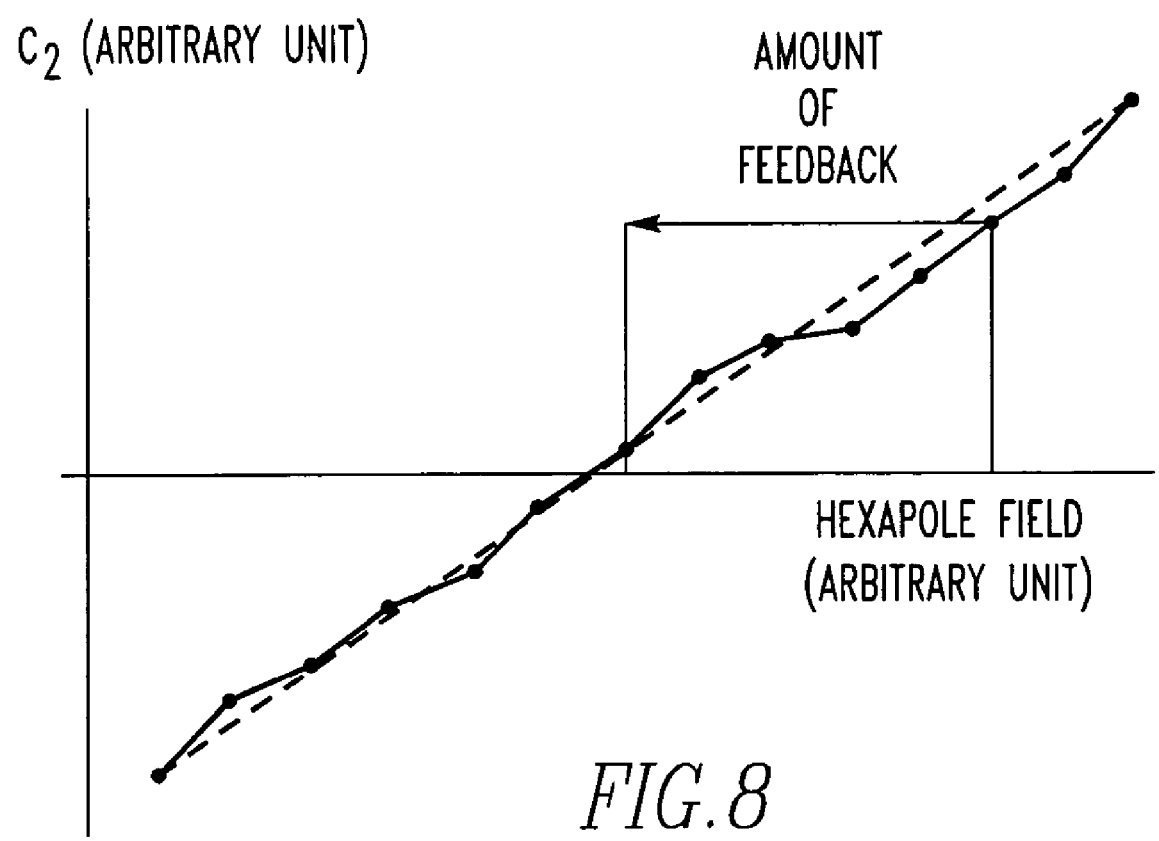
FIG. 8 is a graph showing variations in $C_2$ when the hexapole field is varied.

Quantification of the probe profiles according to Equations (11)–(22) has shown that only $C_2$ shown in Equation (13) varied greatly but the others varied little. Variations in the $C_2$ were graphed as shown in FIG. 8, which shows the relation between the hexapole field and $C_2$. In the graph, the hexapole field is plotted on the horizontal axis, while $C_2$ is on the vertical axis. They are represented in arbitrary units. The value between the value of the hexapole field corresponding to some value of $C_2$ and the value at which $C_2$ is zero is the amount of feedback.

As shown in this graph, there is a linear relationship between $C_0$–$C_{11}$ shown in Equations (11)–(22) and their corresponding fields (see Equations (23)–(34)). Therefore, the tilt of this straight line is previously found by a simulation or experiment. The aberrations can be corrected by multiplying the outputs $C_0$–$C_{11}$ from the aberration calculator 30 by the reciprocals of the tilts of straight lines corresponding to the outputs $C_0$–$C_{11}$ and applying fields that are −1 times these fields to the aberration corrector 22. In practice, the feedback gain may be set to about −0.5 times the reciprocals of the tilts of the straight lines to prevent hunting.

As mentioned previously, the field given by H1x:H4x=−1:1 principally varies only $C_2$. Roughly speaking, fields which principally vary only $C_0$–$C_{11}$, respectively, are as follows.

[Mathematical Formulas 19]

$$C_0:(H1x,H2x,H4x)=(-1,1,1) \quad (23)$$

$$C_1:(H1y,H3y,H4y)=(1,1,-1) \quad (24)$$

$$C_2:(H1x,H4x)=(-1,1) \quad (25)$$

$$C_3:(H1y,H4y)=(-1,1) \quad (26)$$

$$C_4:(Q2x,Q3x)=(1,-1) \quad (27)$$

$$C_5:(Q2x,Q3x)=(1,1) \quad (28)$$

$$C_6:(Q4y)=(1) \quad (29)$$

$$C_7:(Q1x,Q4x)=(1,1) \quad (30)$$

$$C_8:(Q1x,Q4y)=(1,1) \quad (31)$$

$$C_9:(O1x,O2x,O3x,O4x)=(2,-1,-1,2) \quad (32)$$

$$C_{10}:(O2x,O3x)=(-1,1) \quad (33)$$

$$C_{11}:(O1y,O4y)=(-1,1) \quad (34)$$

By using the fields of Equations (23)–(34), the feedback gain matrix (described later) becomes a diagonal matrix.

To illustrate this, a simple case in which two aberrations $C_4$ and $C_5$ are corrected using two fields of Q2x and Q3x is now discussed. When Q2x is varied by $\Delta$Q2x, $C_4$ varies by a*$\Delta$Q2x, and $C_5$ varies by b*$\Delta$Q2x. Furthermore, when Q3x is varied by $\Delta$Q3x, $C_4$ varies by c*$\Delta$Q3x, and $C_5$ varies by d*$\Delta$Q3x. In these formulas, a, b, c, and d are constants.

It is assumed that when Q2x and Q3x are varied by $\Delta$Q2x and $\Delta$Q3x, respectively, C4 and $C_5$ vary by $\Delta C_4$ and $\Delta C_5$, respectively. These variations $\Delta C_4$ and $\Delta C_5$ are given by

[Mathematical Formula 20] (35)

$$\begin{pmatrix} \Delta C_4 \\ \Delta C_5 \end{pmatrix} = \begin{pmatrix} a & c \\ b & d \end{pmatrix} \begin{pmatrix} \Delta Q2x \\ \Delta Q3x \end{pmatrix}$$

Thus, $\Delta$Q2x and $\Delta$Q3x are given by

[Mathematical Formula 21] (36)

$$\begin{pmatrix} \Delta Q2x \\ \Delta Q3x \end{pmatrix} = \begin{pmatrix} A & C \\ B & D \end{pmatrix} \begin{pmatrix} \Delta C_4 \\ \Delta C_5 \end{pmatrix}$$

Note that

[Mathematical Formula 22]

$$\begin{pmatrix} A & C \\ B & D \end{pmatrix}$$

is the inverse matrix of

[Mathematical Formula 23]

$$\begin{pmatrix} a & c \\ b & d \end{pmatrix}$$

Consequently, it can be seen that $C_4$ and $C_5$ can both be set to 0 by varying Q2x and Q3x by $\Delta$Q2x and $\Delta$Q3x, respectively, which are given by

[Mathematical Formula 24] (37)

$$\begin{pmatrix} \Delta Q2x \\ \Delta Q3x \end{pmatrix} = \begin{pmatrix} -A & -C \\ -B & -D \end{pmatrix} \begin{pmatrix} C_4 \\ C_5 \end{pmatrix}$$

[Mathematical Formula 25]

$$\begin{pmatrix} -A & -C \\ -B & -D \end{pmatrix}$$

that is included in Equation (37) is known as a feedback gain matrix.

On the other hand, using the fields of Equations (27) and (28) makes the feedback gain matrix a diagonal matrix, for the following reason.

To express the manner in which Q2x and Q3x are varied at a ratio of 1:−1 or at a ratio of 1:1, the field of (Q2x, Q3x)=(1, −1) is abbreviated as q2. The field of (Q2x, Q3x)=(1, 1) is abbreviated as q3. For example, fields given by Q2x=10 and Q3x=6 are equivalent to fields given by q2=2 and q3=8.

Since it is known that when q2 is varied, only $C_4$ varies and when q3 is varied, only $C_5$ varies, it is assumed that when q2 and q3 are varied by $\Delta$q2 and $\Delta$q3, respectively, $C_4$ and $C_5$ vary by $\Delta C_4$ and $\Delta C_5$, respectively, which are given by

[Mathematical Formula 26] (38)

$$\begin{pmatrix} \Delta C_4 \\ \Delta C_5 \end{pmatrix} = \begin{pmatrix} g_4 & 0 \\ 0 & g_5 \end{pmatrix} \begin{pmatrix} \Delta q2 \\ \Delta q3 \end{pmatrix}$$

where $g_4$ and $g_5$ are constants. Therefore, the following equation holds:

[Mathematical Formula 27] (39)

$$\begin{pmatrix} \Delta q2 \\ \Delta q3 \end{pmatrix} = \begin{pmatrix} G_4 & 0 \\ 0 & G_5 \end{pmatrix} \begin{pmatrix} \Delta C_4 \\ \Delta C_5 \end{pmatrix}$$

where $G_4=1/g_4$ and $G_5=1g_5$. Thus, it can be seen that q2 and q3 should be varied by $\Delta$q2 and $\Delta$q3, respectively, in order to set both $C_4$ and $C_5$ to 0, it being noted that $\Delta$q2 and $\Delta$q3 are given by

[Mathematical Formula 28] (40)

$$\begin{pmatrix} \Delta q2 \\ \Delta q3 \end{pmatrix} = \begin{pmatrix} -G_4 & 0 \\ 0 & -G_5 \end{pmatrix} \begin{pmatrix} C_4 \\ C_5 \end{pmatrix}$$

In this formula, the feedback gain matrix is a diagonal matrix.

Where the fields of Q2x and Q3x are used as in Equation (37), four values A, B, C, and D must be adjusted when the feedback gain is experimentally adjusted or automatically varied. On the other hand, where the fields of q2 and q3 are used as in Equation (40), the feedback gain matrix is a diagonal matrix. Therefore, there are two parameters to be adjusted. Also, there is a direct relationship between the aberration and field. These facilitate understanding.

The aberration-correcting field found in this way is applied to the corrector power supply 33. Since this power supply 33 corrects the aberration corrector 22 according to the input signal, aberrations can be suppressed.

In this way, according to the present invention, processing for blurring regions close to the four sides is performed about image data obtained by scanning a specimen with a beam. Consequently, artifacts produced at peripheries of the obtained image can be removed. Hence, the probe profile can be found accurately. Amounts of corrections are computed by the correction amount-calculating means based on the probe profile. Therefore, the amounts of corrections can be calculated precisely. Thus, automatic method and apparatus can be offered which permit an operator to perform automated correction with ease unconsciously of a complex procedure.

Furthermore, amounts of features about line profiles are not limited to $\mu$, $\sigma$, and $\rho$ as in Equations (8)–(10). Other amounts indicating the left-and-right asymmetry, width, and unevenness around the center may also be used. For example, the conceivable width is not restricted to the standard deviation a. Half-value width and integral 50% width may also be available.

Further, if the accuracy at which aberrations are quantified from a probe profile is poor, the tendency might be seen by viewing the history of variations in the amounts of aberrations. Therefore, the feedback amount-setting device may take account of the history of variations in the amounts of aberrations. This also produces the advantage that hunting can be prevented.

In addition, the aforementioned method of correcting aberrations can be applied to every kind of aberration corrector. Especially, the method can also be applied to the functions of autofocus and autostigmator.

The advantages of the present invention are as follows.

1. Since regions close to the four sides of each image are blurred by the four-sided region-blurring device in response to the obtained image signal, artifacts can be removed. As a result, the extracted probe profile assumes a desirable form. As a result, excellent corrective computations can be performed.

2. Since the procedure of aberration correction is automated, even a general operator who does not know a manual method of aberration correction can produce high-resolution images.

3. Since aberrations are expressed as Fourier components of $\mu$, $\sigma$, and $\rho$ as given in Equations (11)–(22), if two or more aberrations coexist, they can be independently quantified.

4. Since plural aberrations can be corrected at the same time, automatic correction can be made at high speed.

5. Since only large quantified aberrations can be selectively corrected from quantified aberrations, hunting of the system is unlikely to occur.

6. Since fields which make the feedback gain matrix a diagonal matrix are used, it is easy to control different aberrations independently.

Having thus described my invention with the detail and particularity required by the Patent Laws, what is desired protected by Letters Patent is set forth in the following claims.

The invention claimed is:

1. A method of automatically correcting aberrations in a charged-particle beam, comprising the steps of:
    storing image data into a memory, the image data being obtained by scanning a specimen with the charged-particle beam;
    reading the image data from said memory and blurring regions close to four sides of an image represented by the image data;
    extracting a profile of a probe formed by said charged-particle beam from the image that has been blurred by the immediately preceding step;
    extracting line profiles from the extracted profile of the probe;
    performing extraction of amounts of features, calculations of aberrations, judgments on corrections of the aberrations, and setting of an amount of feedback about the obtained line profiles; and
    correcting conditions under which an aberration corrector is driven, based on the obtained amount of feedback, the aberration corrector acting to correct the aberrations in the charged-particle beam.

2. An apparatus for automatically correcting aberrations in a charged-particle beam, said apparatus comprising:
    an aberration corrector for correcting the aberrations in the charged-particle beam;
    a memory for storing image data obtained by scanning a specimen with the charged-particle beam;
    a four-sided region-blurring device for reading the image data from said memory and blurring regions close to four sides of an image represented by said image data;
    a probe profile extractor for extracting a probe profile of the charged-particle beam from the image which has been blurred by the immediately preceding step;
    a line profile extractor for extracting line profiles from the extracted probe profile;
    correction amount-calculating means for performing extraction of amounts of features, calculations of aberrations, judgment on corrections of the aberrations, and setting of an amount of feedback about the extracted line profiles; and
    correcting means for correcting conditions under which the aberration corrector is driven, based on the amount of feedback obtained by said correction amount-calculating means.

3. A method for automatically correcting aberrations in a charged-particle beam as set forth in claim 1, wherein background noise contained in the probe profile is removed by automatically adjusting an amount by which the regions close to the four sides are blurred by said four-sided region-blurring device.

* * * * *

UNITED STATES PATENT AND TRADEMARK OFFICE
CERTIFICATE OF CORRECTION

| | | |
|---|---|---|
| PATENT NO. | : 7,145,154 B2 | Page 1 of 1 |
| APPLICATION NO. | : 11/016562 | |
| DATED | : December 5, 2006 | |
| INVENTOR(S) | : Uno | |

It is certified that error appears in the above-identified patent and that said Letters Patent is hereby corrected as shown below:

Face of the Patent, insert

Item -- (30)  Foreign Application Priority Data

Dec 17, 2003                    JP                2003-419857--

Signed and Sealed this

Twenty-second Day of May, 2007

JON W. DUDAS
*Director of the United States Patent and Trademark Office*